(12) United States Patent
Kuo (10) Patent No.: US 7,714,375 B2
(45) Date of Patent: May 11, 2010

(54) FLASH MEMORY WITH 4-BIT MEMORY CELL

(75) Inventor: Ming-Chang Kuo, Changhua County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 350 days.

(21) Appl. No.: 11/760,646

(22) Filed: Jun. 8, 2007

(65) Prior Publication Data
US 2008/0303077 A1    Dec. 11, 2008

(51) Int. Cl.
*H01L 29/788* (2006.01)

(52) U.S. Cl. .................... 257/315; 257/316

(58) Field of Classification Search ......... 257/314–320, 257/E21.422, E21.68, E21.681
See application file for complete search history.

(56) References Cited

U.S. PATENT DOCUMENTS

| | | | |
|---|---|---|---|
| 5,633,519 A * | 5/1997 | Yamazaki et al. | 257/315 |
| 7,122,857 B2 * | 10/2006 | Lin et al. | 257/316 |
| 2004/0207002 A1 * | 10/2004 | Ryu et al. | 257/315 |

* cited by examiner

*Primary Examiner*—Hung Vu
(74) *Attorney, Agent, or Firm*—Jianq Chyun IP Office (57) ABSTRACT

A memory device having at least one memory cell, and each memory cell is configured to store multiple bits. Each bit is stored in a charge storage layer of the memory cell. The memory device can include a double gate structure that can store 4-bits per cell that expands the density of the non-volatile memory device such as flash memory.

10 Claims, 13 Drawing Sheets

FLASH MEMORY WITH 4-BIT MEMORY CELL

FIELD

This invention relates generally to memory devices and, more particularly, to a flash memory with 4-bit memory cell and method for fabricating the same.

BACKGROUND

Memory devices have seen explosive growth with the advancement of electronic applications, such as memory cards, portable electronic devices, cell phones, MP3 players, digital and video cameras, and other consumer electronics. Application requirements for low cost, power consumption and high performance are driving memory design to different architectures. Floating gate structures continue to dominate non-volatile memory technology. These structures typically use polysilicon floating gates as the storage node and are arranged in various memory arrays to achieve architectures such as NAND flash and NOR flash memory. To program and erase the memory cell, electron tunneling methods are used to place or remove electrons from the floating gate.

Figure 1:
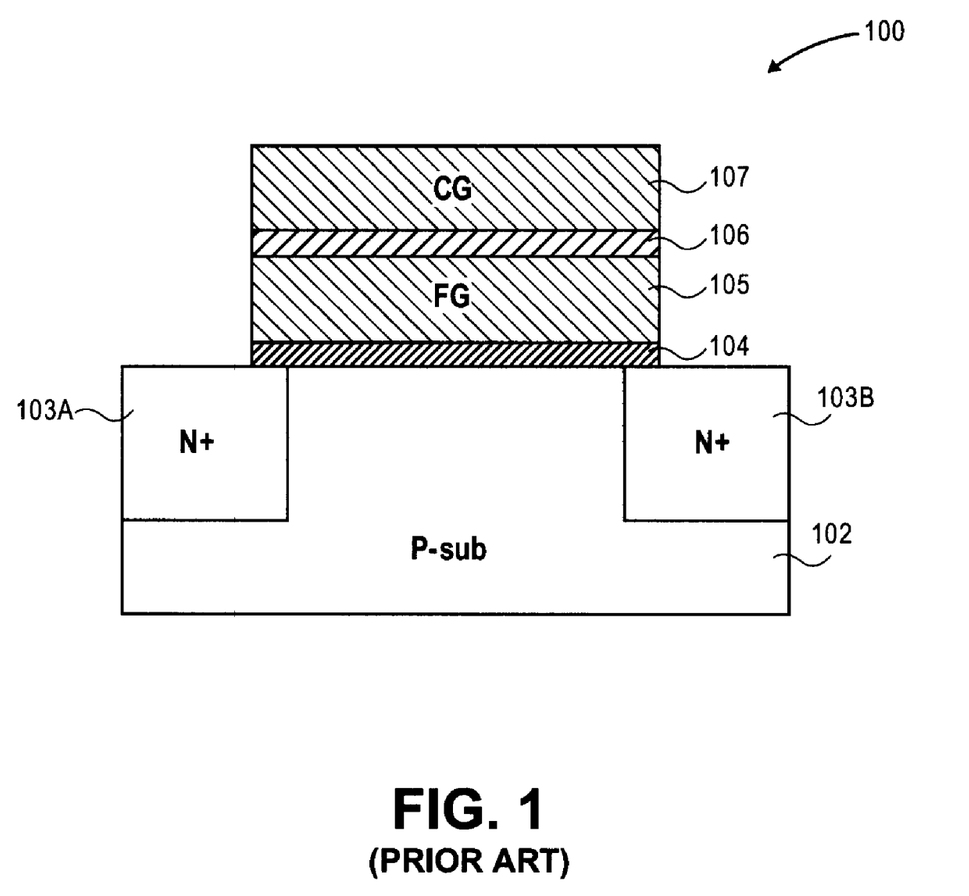
FIG. 1 illustrates a prior art memory structure having a 1-bit memory cell.

FIG. 1 shows a prior art flash memory structure 100 having a 1-bit memory cell. The memory structure 100 includes a P-type substrate 102 having N+ dopant diffused areas 103. A tunnel oxide layer 104 is formed on P-type substrate 102 above the N+ dopant areas that function as a drain and source 103A and 103B, respectively. A first polysilicon layer 105 is formed on the tunnel oxide layer 104 that functions as a floating gate (floating gate 105). A dielectric layer 106 is formed on the floating gate layer 105 with a second polysilicon layer 107 formed on the dielectric layer 106 that functions as a control gate (control gate 107). Depending on the voltage applied to the control gate 107, electron tunneling through the tunnel oxide layer 104 will place or remove electrons in the floating gate 105 to store 1-bit of data. This type of prior memory structure only stores 1-bit of data per memory cell. Because of increased density requirements in consumer electronics, there is a need for memory devices to have more than 1-bit of data per memory cell.

SUMMARY

According to one aspect of the invention, a memory device is disclosed having a plurality of memory cells. Each memory cell is configured to store at least four data bits. Each memory cell includes first and second floating gates. The first floating gate has a charge storage layer to store a $1^{st}$ data bit and the second floating gate has charge storage layer to store a $2^{nd}$ data bit. Each memory cell also includes third and fourth floating gates. The third floating gate has a charge storage layer to store a $3^{rd}$ data bit and the fourth floating gate has a charge storage layer to store a $4^{th}$ data bit. The first control gate controls the $1^{st}$ and $2^{nd}$ data bits stored in the first and second floating gates, respectively; and second control gate controls the $3^{rd}$ and $4^{th}$ data bits stored in the third and fourth floating gates, respectively.

According to another aspect of the invention, a memory device is disclosed having a plurality of memory cells, word lines, and bit lines. Each memory cell has a plurality of floating gates and control gates, wherein each floating gate includes a charge storage layer, and wherein each memory cell includes top and bottom control gates. Each control gate controls at least two respective data bits. The plurality of word lines and bit lines are coupled to the floating gates and control gates for the memory cells.

According to another aspect of the invention, a method for making a memory device is disclosed. A first polysilicon layer is formed over a substrate. Portions of the first polysilicon layer are removed such that the first polysilicon layer is divided into a plurality of sections to form at least one control gate and two floating gates. A semiconductor layer is formed over the first polysilicon layer. A second polysilicon layer is formed over the semiconductor layer. Portions of the second polysilicon layer are removed such that the second polysilicon layer is divided into a plurality of sections to form at least one gate control and two floating gates. Source and drain areas are formed in the semiconductor layer.

According to another aspect of the invention, a method for making a memory device is disclosed. A polysilicon layer is formed over a substrate. Portions of the polysilicon layer are removed such that the polysilicon layer is divided into a plurality of sections to form at least one control gate and two floating gates. Source and drain areas are formed in the semiconductor layer.

BRIEF DESCRIPTION OF THE DRAWINGS

The accompanying drawings, which are incorporated in and constitute part of this specification, illustrate examples and exemplary embodiments of the invention, and together with the description, serve to explain the principles of the invention. In the drawings.

DETAILED DESCRIPTION

Reference will now be made in detail to the exemplary embodiments of the invention, examples of which are illustrated in the accompanying drawings. Wherever possible, the same reference numbers will be used throughout the drawings to refer to the same. The following examples disclose a memory device that increases memory density by using multi-bits per memory cell. According to one example, a non-volatile memory device includes at least one memory cell. Each memory cell is configured to store multiple bits, wherein each bit is stored in a polysilicon storage layer. In another example, the memory device includes a double gate structure that can store 4-bits per cell. Examples of such non-volatile memory devices include electrically erasable programmable read only memory EEPROM or flash memory.

Figure 2:
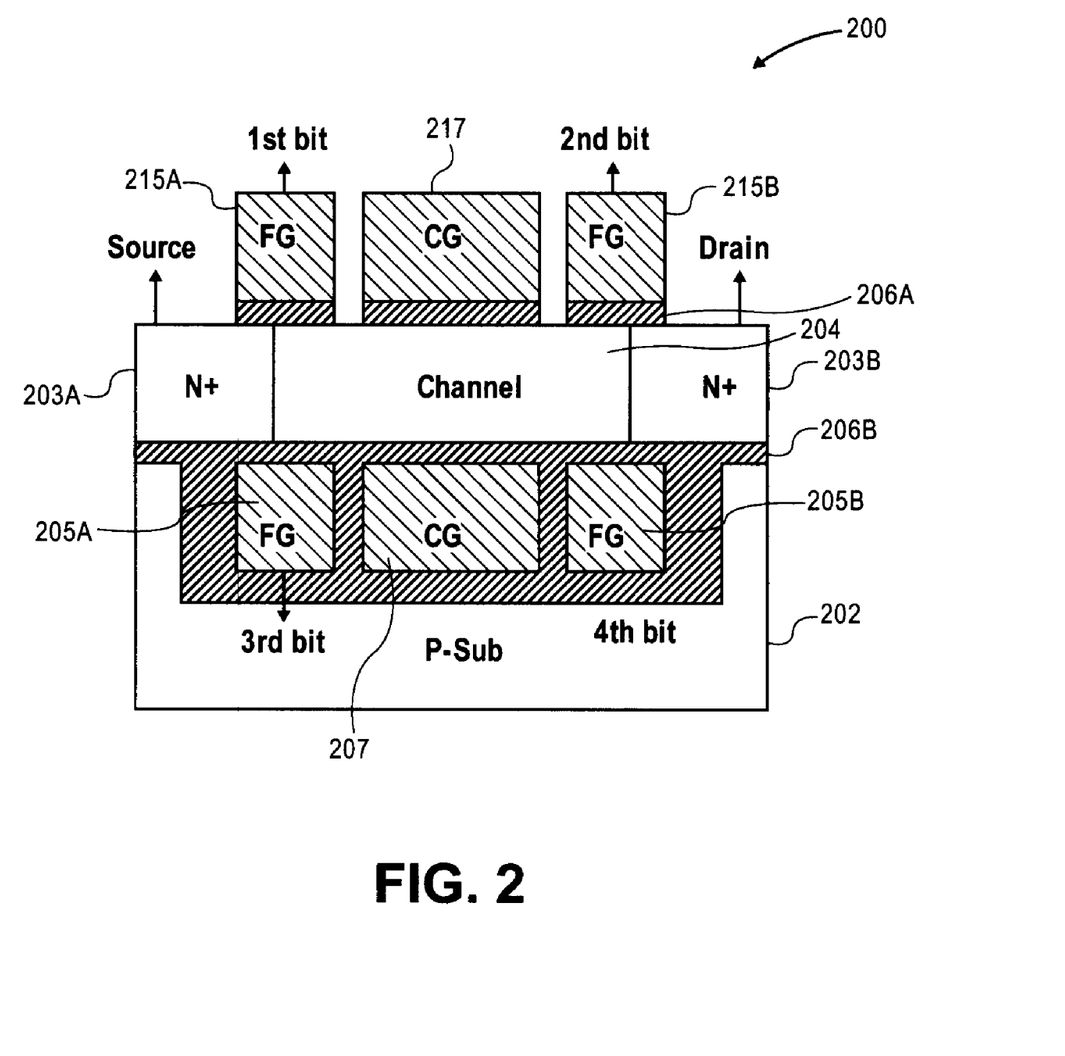
FIG. 2 illustrates one example of a memory structure having a 4-bit memory cell.

FIG. 2 illustrates one example of a memory structure 200 having a 4-bit memory cell. The memory structure 200 includes a P-type substrate 202 with a tunnel channel layer 204, and adjacent N+ type dopant diffused areas formed therein, which functions as a source 203A and a drain 203B. A first dielectric layer 206A is formed on the tunnel channel layer 204 and source 203A and drain 203B. A first and second polysilicon layer are formed on the first dielectric layer 206A, which functions as first and second floating gates 215A and 215B, respectively. The first and second floating gates 215A and 215B can store a respective $1^{st}$ bit and a $2^{nd}$ bit. Under the tunnel channel layer 204, a third and fourth polysilicon layers are formed, which functions as third and fourth floating gates 205A and 205B, respectively. The third and second floating gates 205a and 205b can store respective $3^{rd}$ bit and $4^{th}$ bit. The polysilicon layer of the each of first through forth floating gates (215A-B and 205A-B) thus acts as a polysilicon charge storage layer. The first and second floating gates (215A-B) are separated from the first control gate 217 by a first dielectric layer 206A. The third and fourth floating gates (205A-B) are separated by the second control gate 207 by the second dielectric layers 206B. Examples of the dielectric layer 206A and 206B can include any oxide layer such as $SiO_2$, which acts as a protection layer.

In operation, for programming and erasing functions, different voltage levels can be applied to the first and second control gates 217 and 207 such that electron tunneling occurs in the tunnel channel layer 204 to place or remove electrons from the first through fourth floating gates 215A-B and 205A-B. In this example, there are $2^4=16$ different combinations of bits that can be stored in the memory cell. The multiple bits are thus controlled by the double control gate structure, which are formed above and below the tunnel channel layer 204 from polysilicon layer. For example, in this double control gate structure, the first control gate 217 controls the data bits stored as the $1^{st}$ and $2^{nd}$ bits, and the second control gate 207 controls the data bits stored as the $3^{rd}$ and $4^{th}$ bits. By having multi-bits per memory cell, the memory device can maximize data storage area for the memory device, which can lower costs per bit and improve scalability.

Figure 3A:
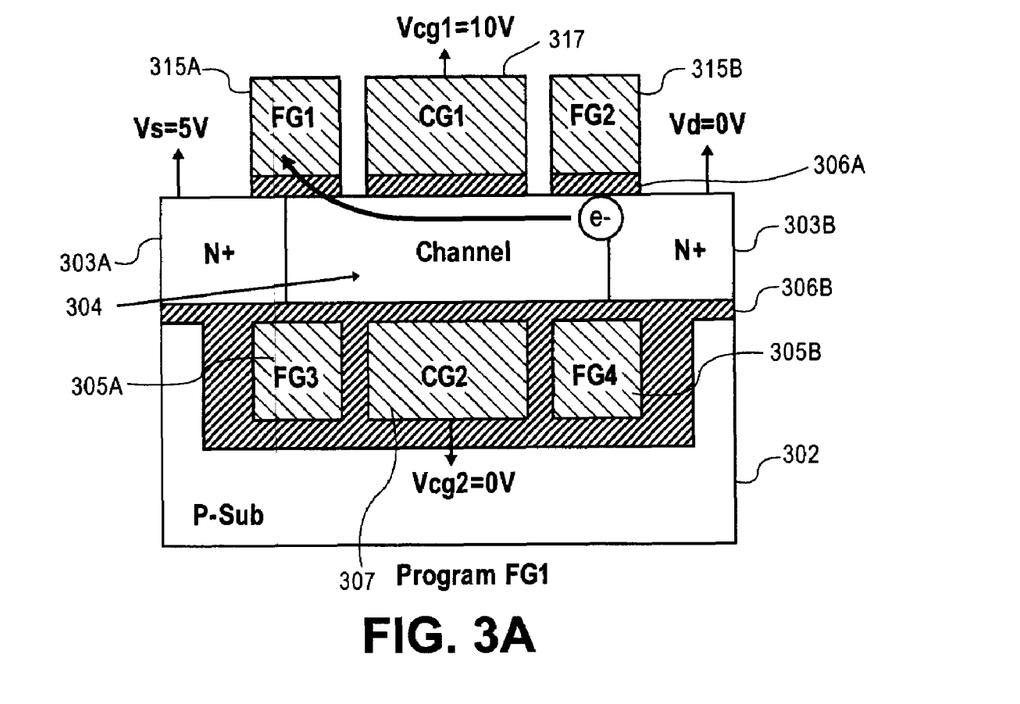
FIGS. 3A-3D illustrate examples of a memory device for programming each bit of a 4-bit memory cell.
Figure 3B:
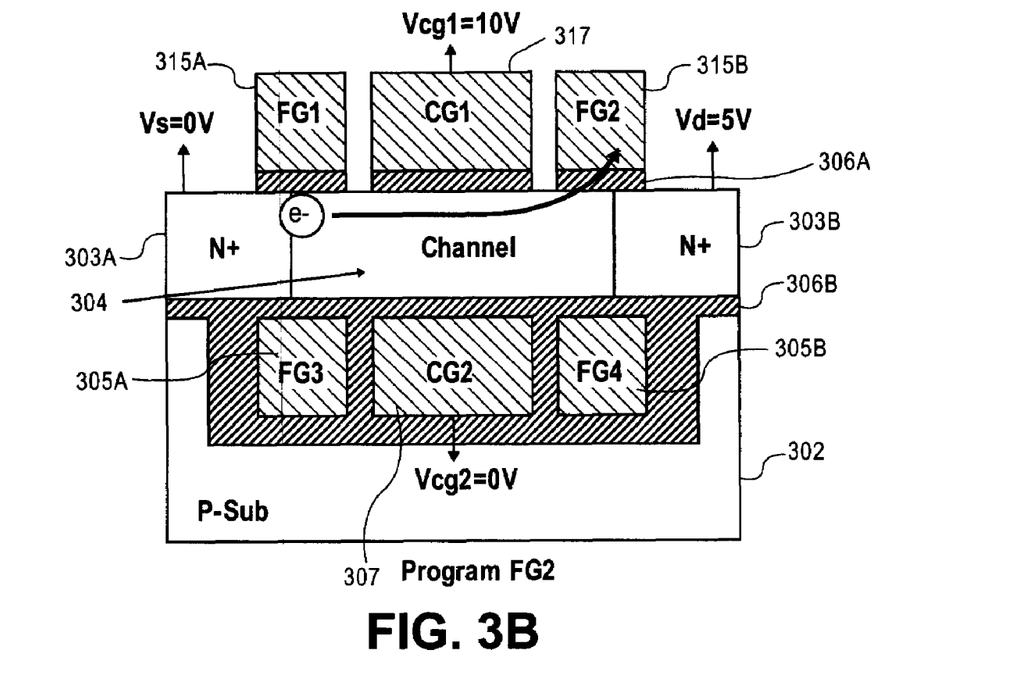

Various operations for the memory device having a 4-bit memory cell will now be described. FIGS. 3A-3D illustrate examples of a memory device for programming each bit of a 4-bit memory cell. Referring to FIG. 3A, in this example, the $1^{st}$ data bit is programmed in the first floating gate 315A (FG1) by applying a first control gate 317 (CG1) voltage $V_{cg1}=10V$ and a second control gate 307 (CG2) voltage $V_{cg2}=0V$, along with a source 303A voltage $V_s=5V$ and a drain 303B voltage $V_d=0V$. In this way, electrons ("e−") move from the drain 303B area of the memory structure to the first floating gate 315A (FG1) by channel hot electron tunneling through the tunnel channel 304 region. Referring to FIG. 3B, in this example, the $2^{nd}$ data bit is programmed in the second floating gate 315B (FG2) by applying a first control gate 317 (CG1) voltage $V_{cg1}=10V$ and a second control gate 307 (CG2) voltage $V_{cg2}=0V$, along with a source 303A voltage $V_s=0V$ and a drain 303B voltage $V_d=5V$. Electrons e− move from the source 303A area to the second floating gate 315B (FG2) by channel hot electron tunneling through the tunnel channel 304 region.

Figure 3C:
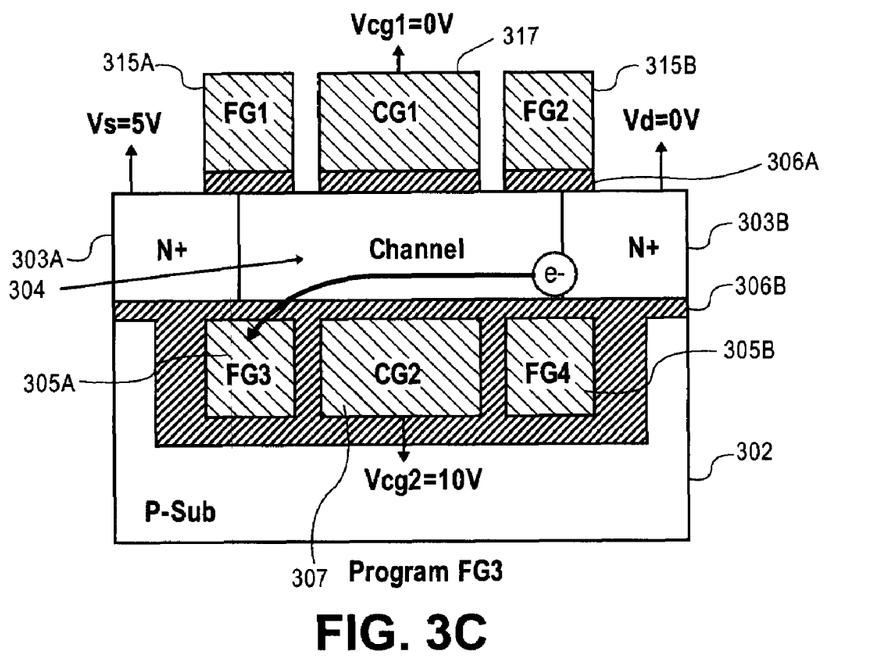
Figure 3D:
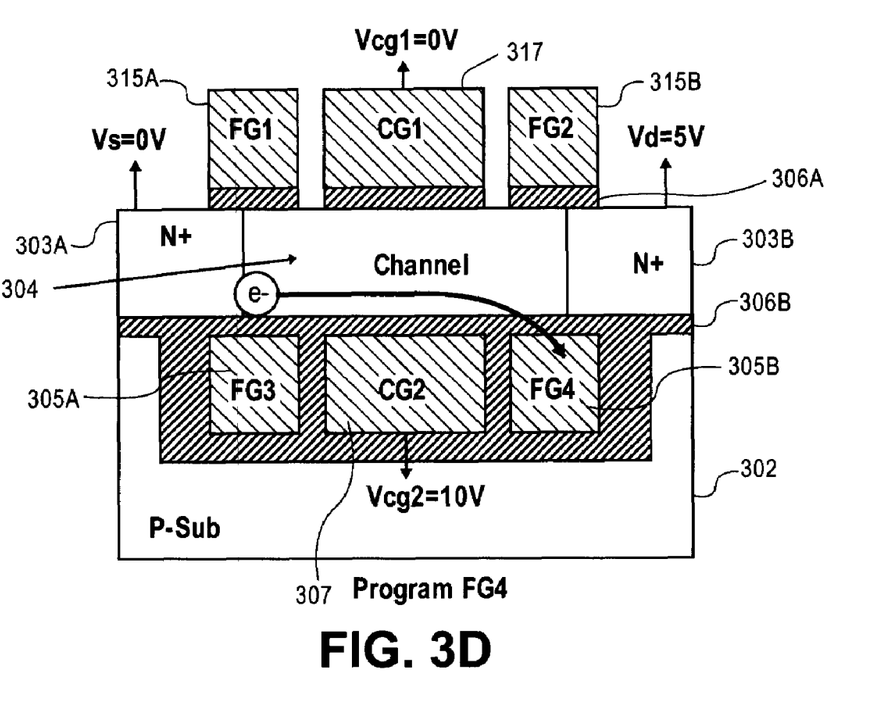

Referring to FIG. 3C, in this example, the 3 data bit is programmed in the third floating gate 305A (FG3) by applying 0V to the first control gate 317 (CG1) and 10V to the second control gate 307 (CG2), along with a source 303A voltage Vs of 5V and a drain 303B voltage of 0V. Electrons ("e−") move from the drain 303B area of the memory structure to the third floating gate 305A (FG3) by channel hot electron tunneling through tunnel channel 304 region. Referring to FIG. 3D, in this example, the $4^{th}$ data bit is programmed in the fourth floating gate 305B (FG4) by applying 0V the first control gate 317 (CG1) and 10V to the second control gate 307 (CG2), along with a source voltage Vs 303A of 0V and a drain voltage Vd 303B of 5V. Electrons e− move from the source 303A area to the fourth floating gate 305B (FG4) by channel hot electron tunneling through the tunnel channel 304 region.

Figure 4A:
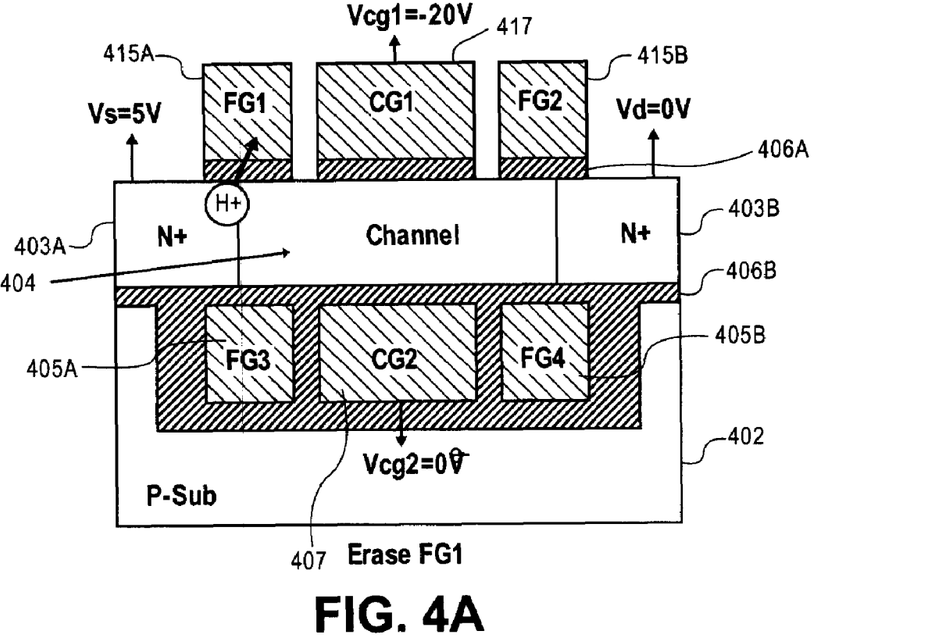
FIGS. 4A-4D illustrate examples of a memory device for erasing each bit of a 4-bit memory cell.
Figure 4B:
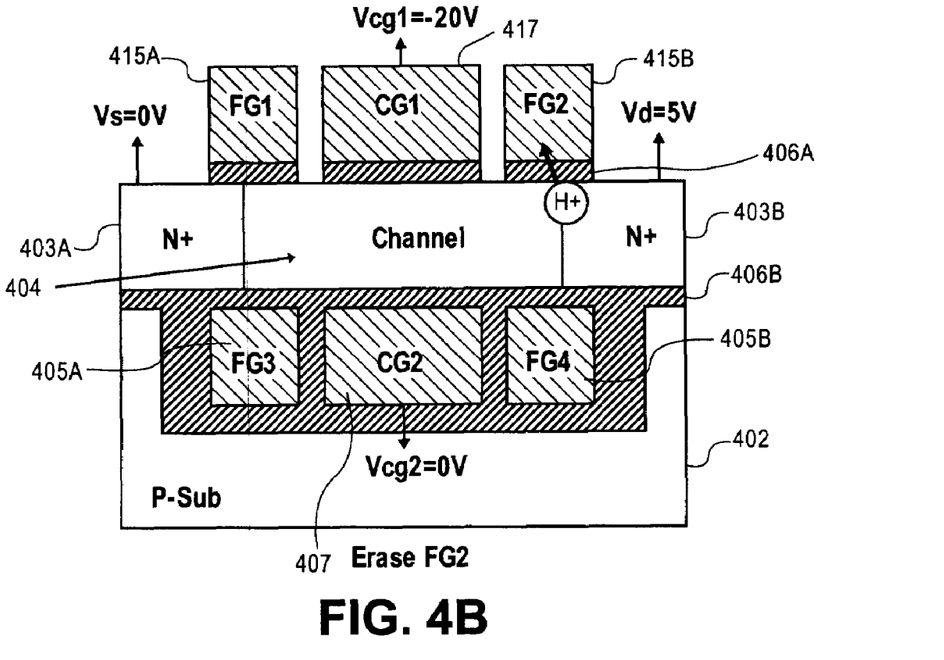

FIGS. 4A-4D illustrate examples of a memory device for erasing each bit of a 4-bit memory cell. Referring to FIG. 4A, in this example, the $1^{st}$ data bit is erased in the first floating gate 415A (FG1) by applying a first control gate 417 (CG1) voltage $V_{cg1}=-20V$ and a second control gate 407 (CG2) voltage $V_{cg2}=0V$, along with a source 403A voltage $V_s=5V$ and a drain 403B voltage $V_d=0V$. In this way, holes ("H+") move from the source 403A area of the memory structure to the first floating gate 415A (FG1) by band to band hot hole tunneling through the tunnel channel 404 region. The holes H+ remove electron e− charges from the first floating gate 415A in order to erase the $1^{st}$ data bit. Referring to FIG. 4B, in this example, the $2^{nd}$ data bit is erased in the second floating gate 415B (FG2) by applying a first control gate 417 (CG1) voltage $V_{cg1}=-20V$ and a second control gate 407 (CG2) voltage $V_{cg2}=0V$, along with a source 403A voltage $V_s=0V$ and a drain 403B voltage $V_d=5V$. Holes ("H+") then move from the drain 403B area of the memory structure to the second floating gate 415B (FG2) by band to band hot hole tunneling through the tunnel channel 404 region. The holes H+ remove electron e− charges from the second floating gate 415B in order to erase the $2^{nd}$ data bit.

Figure 4C:
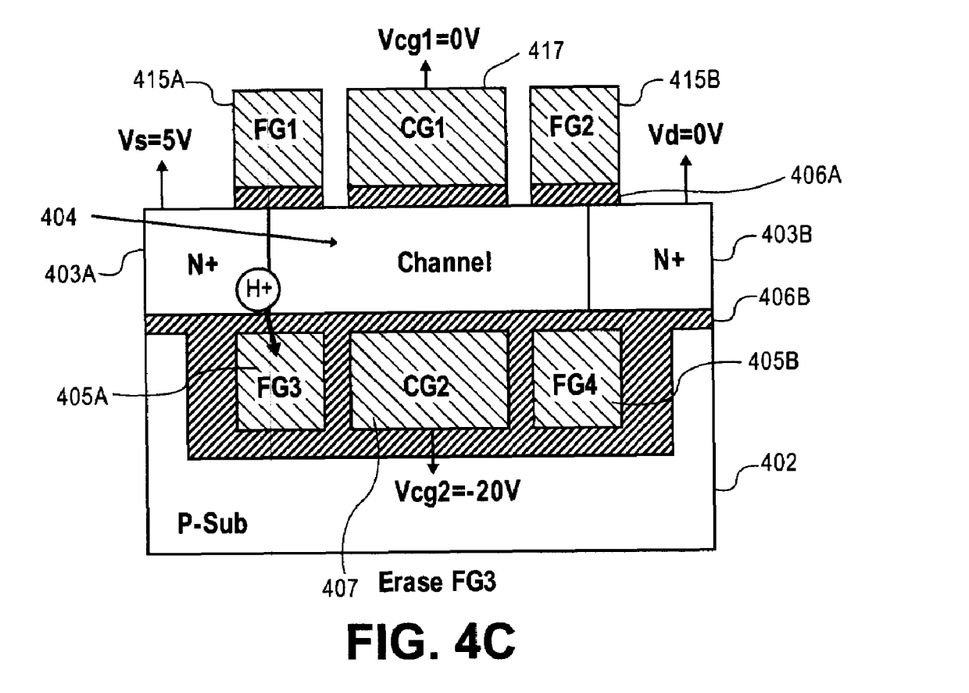
Figure 4D:
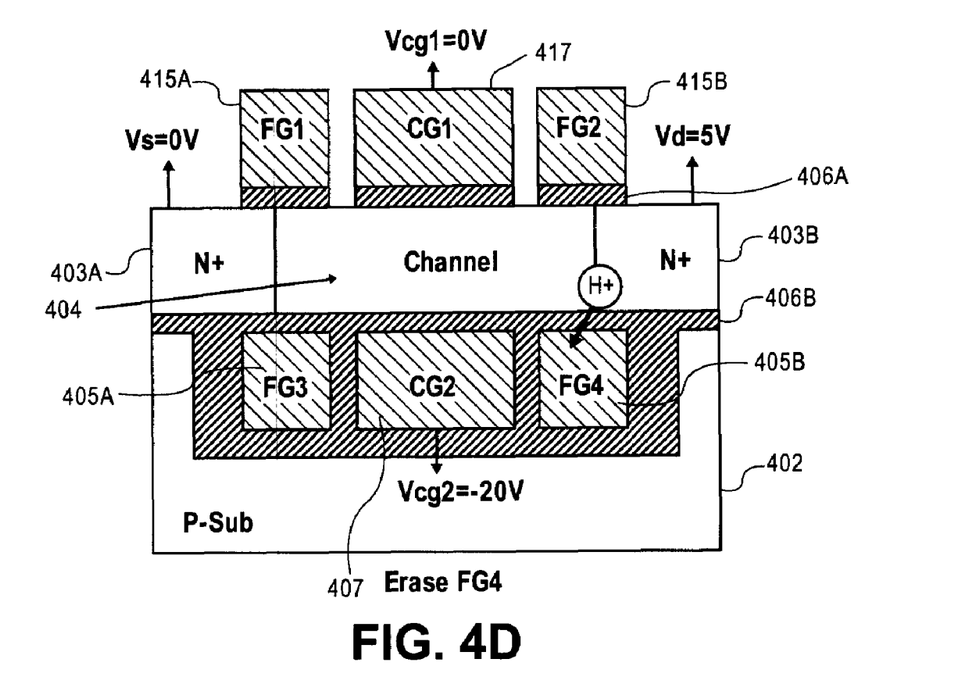

Referring to FIG. 4C, in this example, the $3^{rd}$ data bit is erased in the third floating gate 405A (FG3) by applying a first control gate 417 (CG1) voltage $V_{cg1}=0V$ and a second control gate 407 (CG2) voltage $V_{cg2}=-20V$, along with a source 403A voltage $V_s=5V$ and a drain 403B voltage $V_d=0V$. In this way, holes ("H+") move from the source 403A area of the memory structure to the third floating gate 405A (FG3) by band to band hot hole tunneling through the tunnel channel 404 region. The holes H+ remove electron e− charges from the third floating gate 405A in order to erase the $3^{rd}$ data bit. Referring to FIG. 4D, in this example, the $4^{th}$ data bit is erased in the fourth floating gate 405B (FG4) by applying a first control gate 417 (CG1) voltage $V_{cg1}=0V$ and a second control gate 407 (CG2) voltage $V_{cg2}=-20V$, along with a source 403A voltage $V_s=0V$ and a drain 403B voltage $V_d=5V$. Holes ("H+") then move from the drain 403B area of the memory structure to the fourth floating gate 405B (FG4) by band to band hot hole tunneling through the tunnel channel 404 region. The holes H+ remove electron e− charges from the fourth floating gate 405B in order to erase the $4^{th}$ data bit.

Figure 5A:
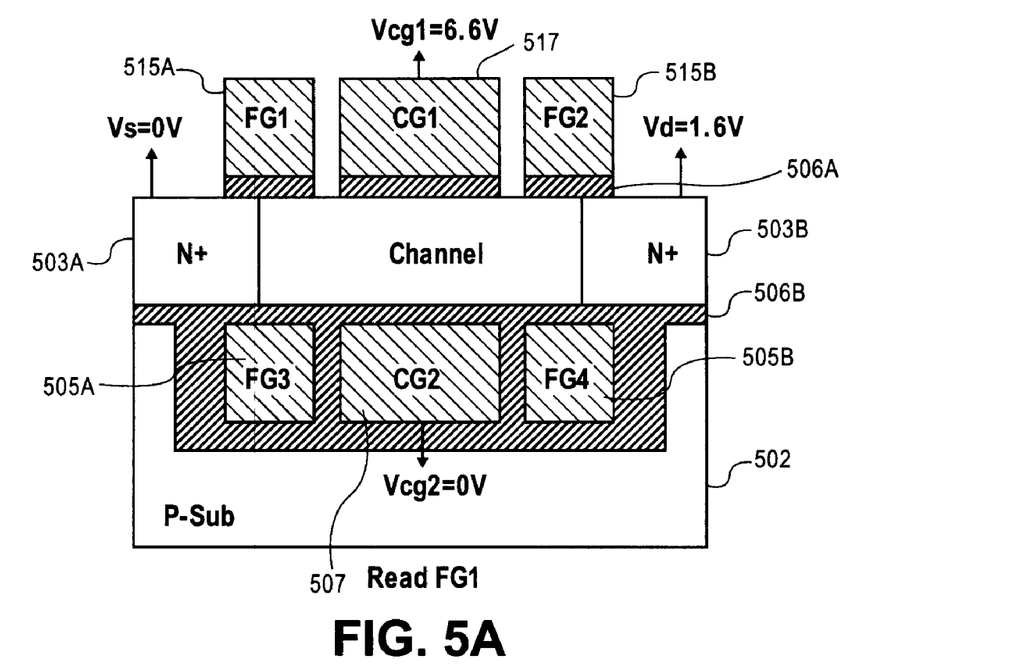
FIGS. 5A-5D illustrate examples of a memory device for reading each bit of a 4-bit memory cell.
Figure 5B:
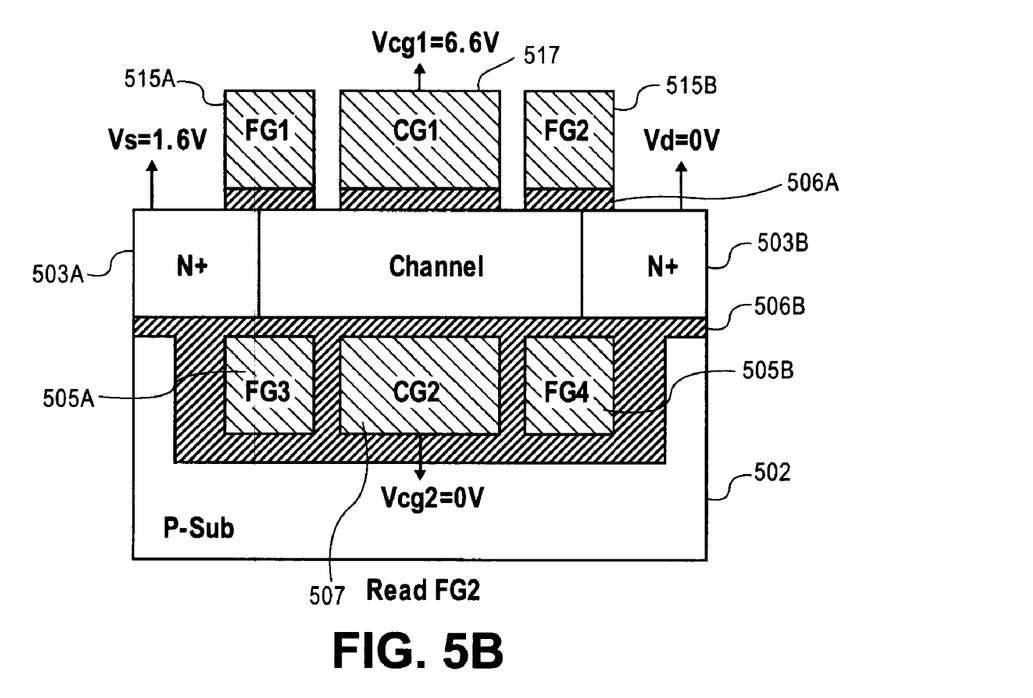

FIGS. 5A-5D illustrate examples of a memory device for reading each bit of a 4-bit memory cell. Referring to FIG. 5A, in this example, the $1^{st}$ data bit stored in the first floating gate 515A (FG1) is read by applying a first control gate 517 (CG1) voltage $V_{cg1}=6.6V$ and a second control gate 507 (CG2) voltage $V_{cg2}=0V$, along with a source 503A voltage $V_s=0V$ and a drain 503B voltage $V_d=1.6V$. In this way, the data stored in the $1^{st}$ data bit of the first floating gate 515A can be sensed or read from a bit line connected to the first floating gate 515A (FG1). Referring to FIG. 5B, in this example, the $2^{nd}$ data bit stored in the second floating gate 515B (FG2) is read by applying a first control gate 517 (CG1) voltage $V_{cg1}=6.6V$ and a second control gate 507 (CG2) voltage $V_{cg2}=0V$, along with a source 503A voltage $V_s=1.6V$ and a drain 503B voltage $V_d=0V$. The data stored in the $2^{nd}$ data bit of the second floating gate 515B can be sensed or read from a bit line connected to the second floating gate 515B (FG2).

Figure 5C:
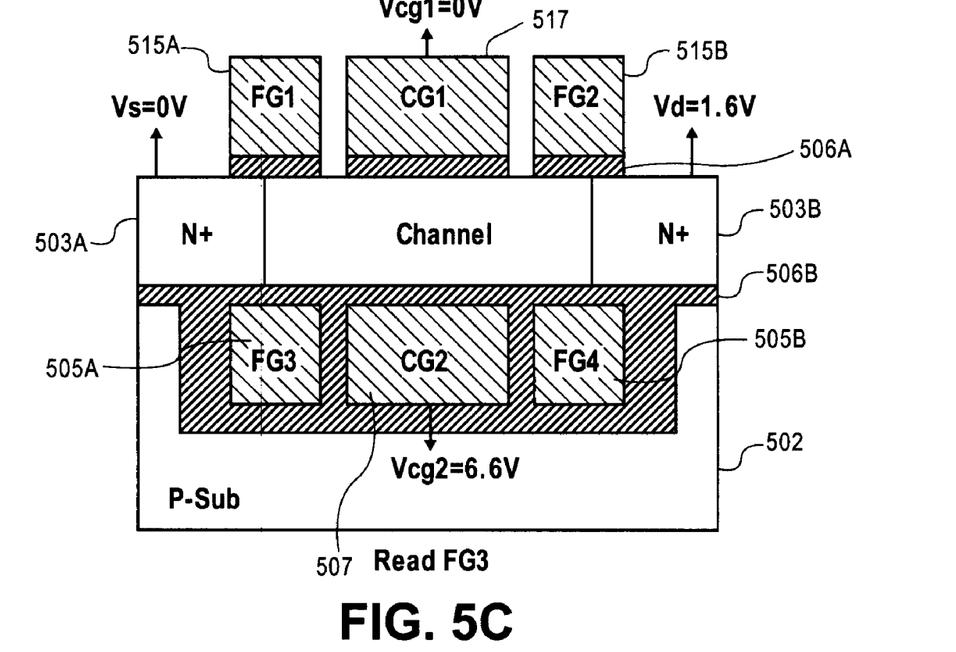
Figure 5D:
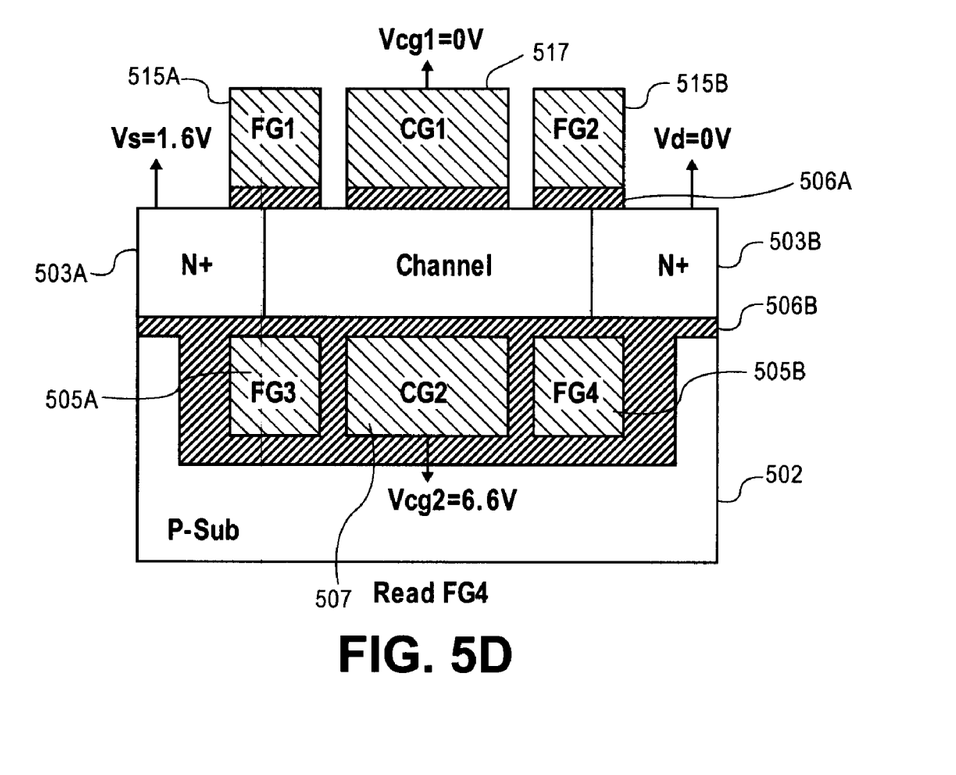

Referring to FIG. 5C, in this example, the $3^{rd}$ data bit stored in the third floating gate 505A (FG3) is read by applying a first control gate 517 (CG1) voltage $V_{cg1}=0V$ and a second control gate 507 (CG2) voltage $V_{cg2}=6.6V$, along with a source 503A voltage $V_s=0V$ and a drain 503B voltage $V_d=1.6V$. In this way, the data stored in the $3^{rd}$ data bit of the third floating gate 505A can be sensed or read from a bit line connected to the third floating gate 505A (FG3). Referring to FIG. 5D, in this example, the $4^{th}$ data bit stored in the fourth floating gate 505B (FG4) is read by applying a first control gate 517 (CG1)

voltage $V_{cg1}$=0V and a second control gate 507 (CG2) voltage $V_{cg2}$=6.6V, along with a source 503A voltage $V_s$=1.6V and a drain 503B voltage $V_d$=0V. The data stored in the $4^{th}$ data bit of the fourth floating gate 505B can be sensed or read from a bit line connected to the fourth floating gate 505B (FG4).

For the above examples of FIGS. 3A-3D, 4A-4D, and 5A-5D, a non-volatile memory can include millions of memory cells arranged in arrays and blocks, along with word lines to access rows of memory cells and bit lines to access the floating and control gates during the program, erase, and read operations. Furthermore, other circuitry and logic (not shown) can be implemented with the above described memory structure to perform such operations.

Figure 6A:
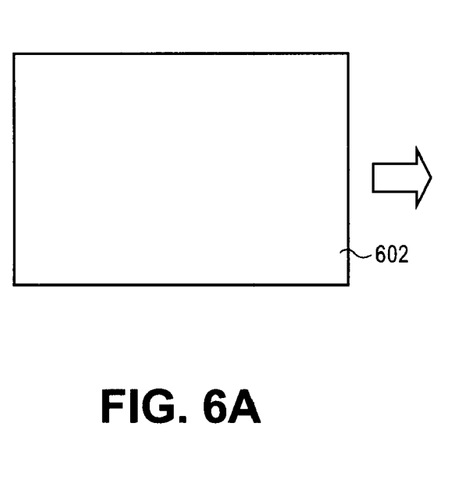
FIGS. 6A-6O illustrate one example of a process method for making a memory device having a 4-bit memory cell.
Figure 6B:
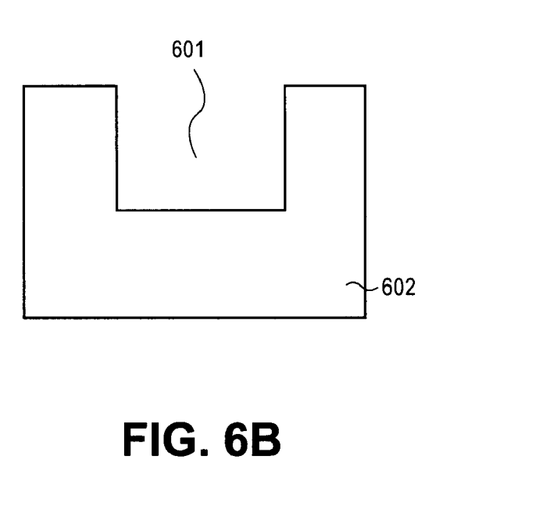
Figure 6C:
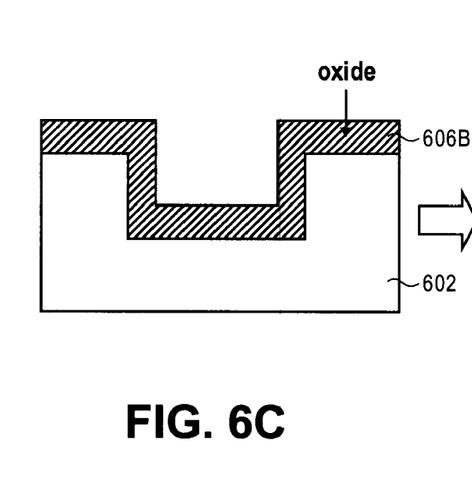
Figure 6D:
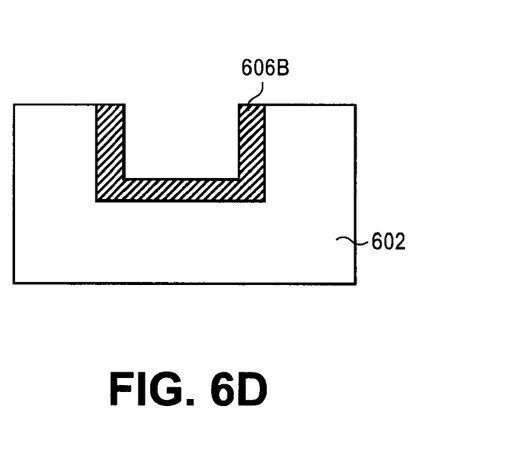

The process of making a non-volatile memory with multi-bits will now be described. FIGS. 6A-6B illustrate one example of a process method for making a memory device having a 4-bit memory cell. Referring to FIG. 6A, a substrate 602 is provided, which can be a silicon Si substrate. The substrate 602 is etched such that the substrate 602 defines a cavity 601 shown in FIG. 6B. Next, referring to FIG. 6C, an oxide layer 606B is deposited over the substrate 602 and cavity 601. Then, portions of the oxide layer 606B are removed by using a chemical mechanical polish technique such that the oxide layer 606B is formed along the surface of the substrate 602 defining the cavity 601 as shown in FIG. 6D.

Figure 6E:
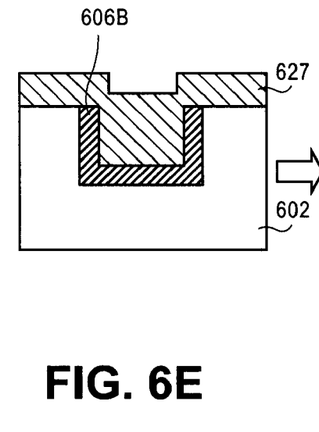
Figure 6F:
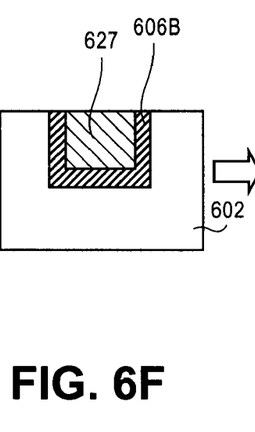
Figure 6G:
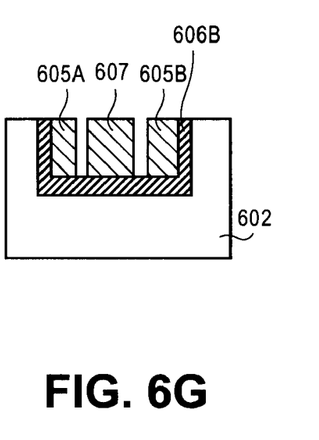
Figure 6H:
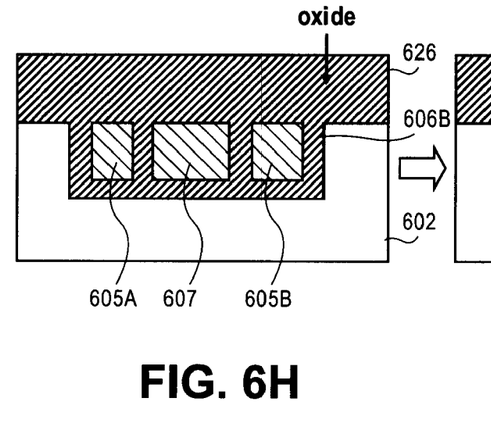
Figure 6I:
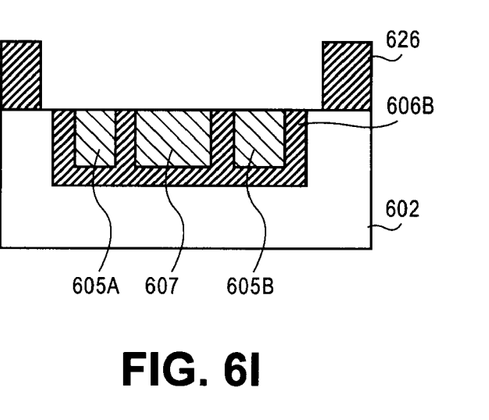

Referring to FIG. 6E, a polysilicon layer 627 is formed over the oxide layer 606b and substrate 602. The polysilicon layer 627 is flattened or smoothed by a chemical mechanical polish process as shown in FIG. 6F. Next, referring to FIG. 6G, the polysilicon layer 627 is etched to form three separate areas of polysilicon, which are identified as 605A, 607, and 605B and will eventually form a bottom pair of floating gates and a bottom control gates. Referring to FIG. 6H, an oxide layer 626 is formed over the three separate areas of polysilicon 605A, 607, and 605B where the oxide layer 626 forms in between areas 607 and 605A and 607 and 605B. The oxide layer 626 is then etched to the polysilicon areas 605A, 607, and 605B, leaving sidewalls as shown in FIG. 6I.

Figure 6J:
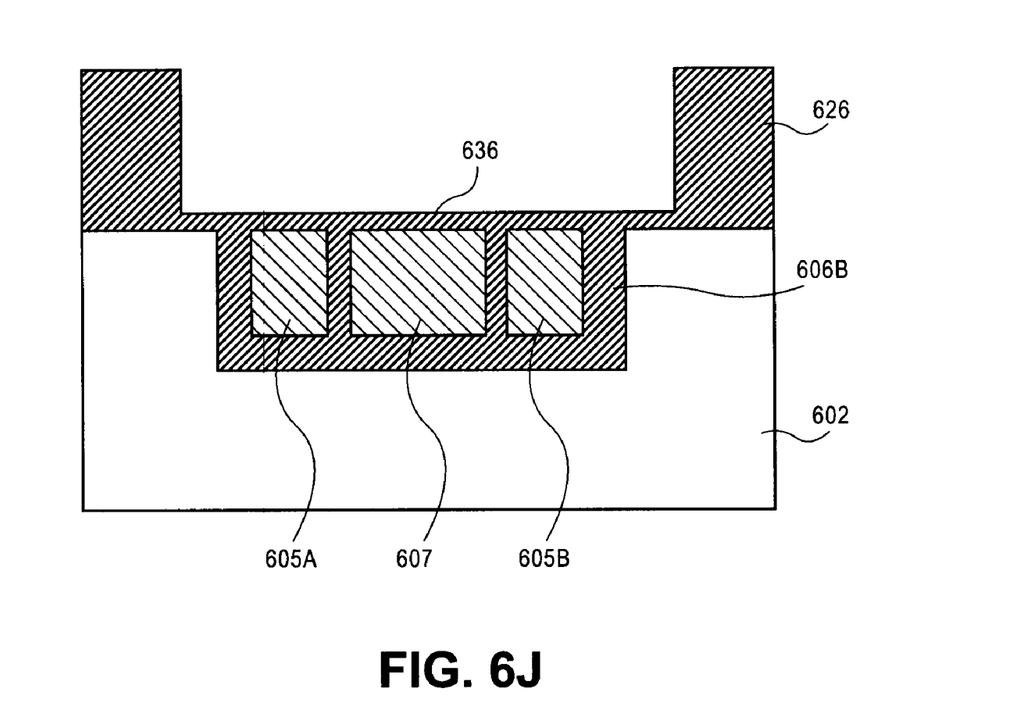
Figure 6K:
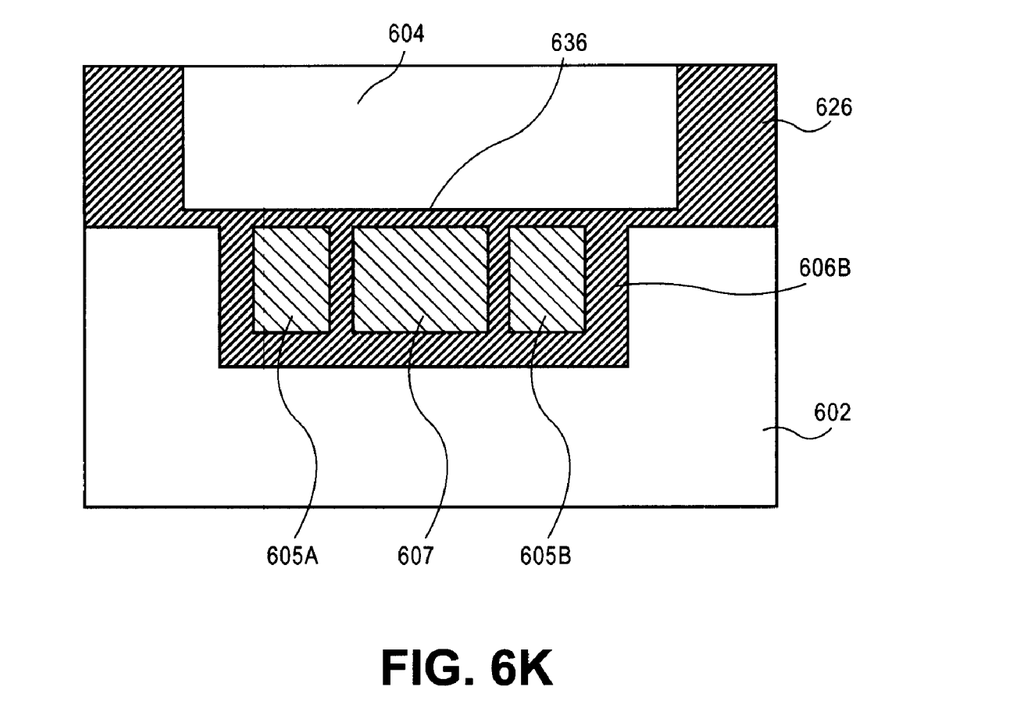
Figure 6L:
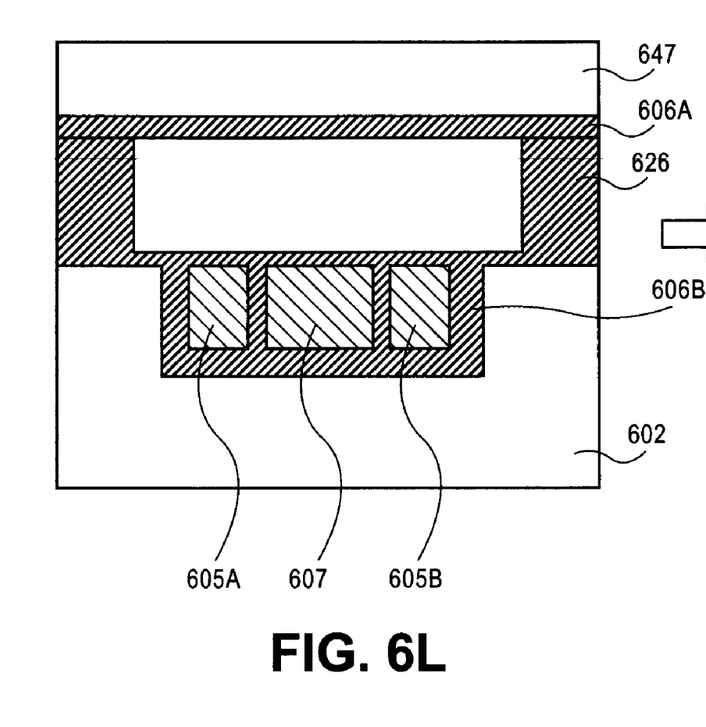
Figure 6M:
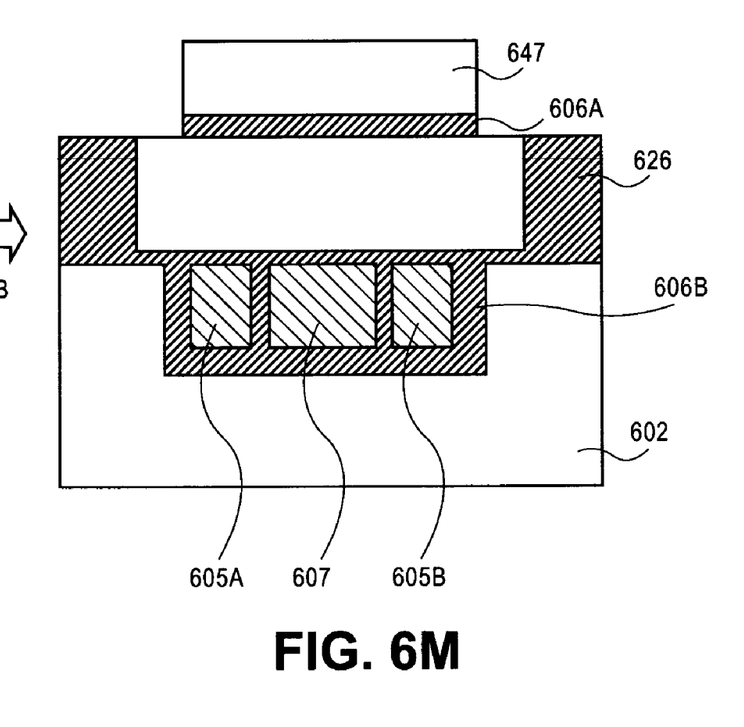
Figure 6N:
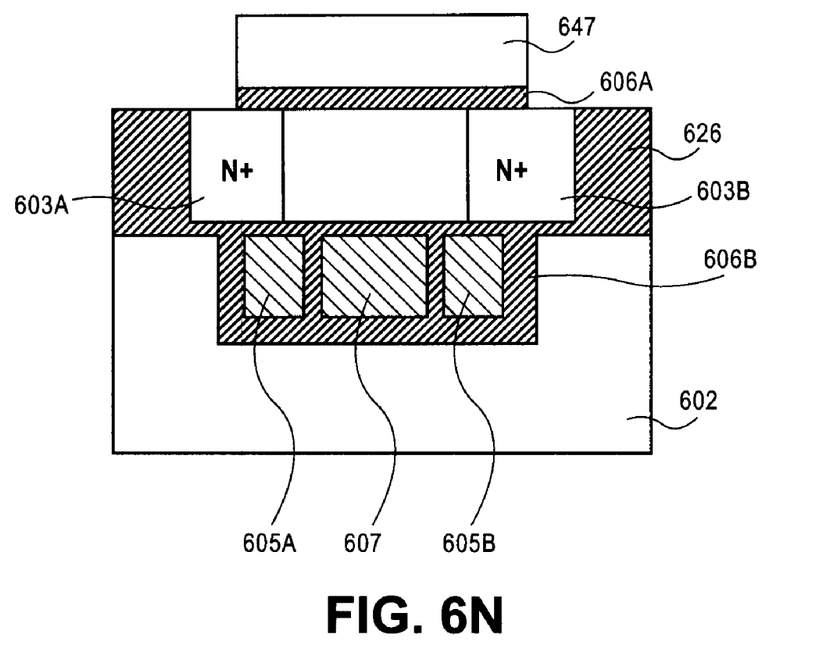
Figure 6O:
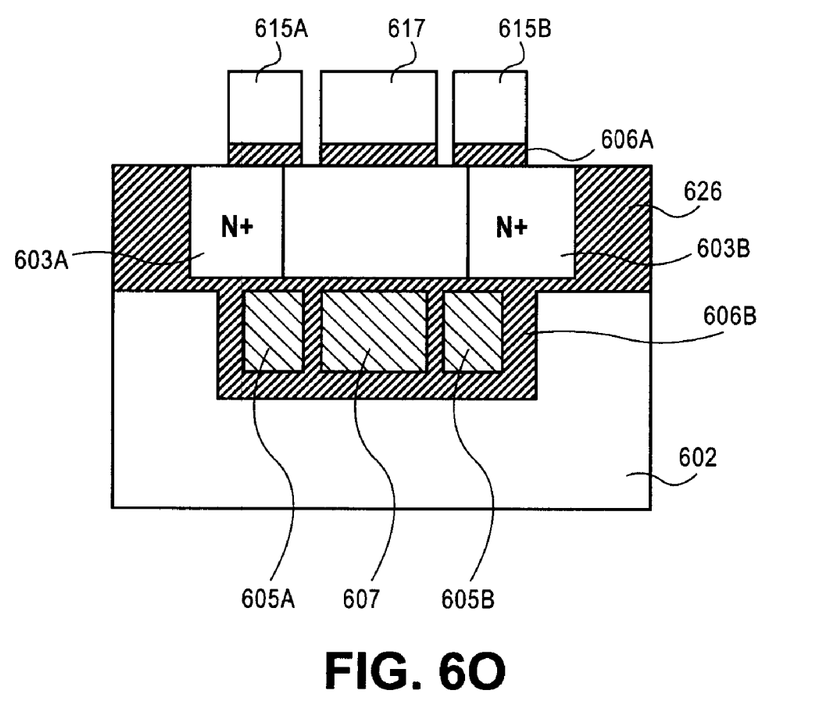

Referring to FIG. 6J, an oxide layer 636 is formed in between oxide layer 626 over the polysilicon layer areas 605A, 607, and 605B. Next, a silicon layer 604 is grown on the oxide layer 636 using an epitaxial lateral overgrowth process as shown in FIG. 6K. The silicon layer 604 is a crystalline material, which can form a tunnel channel region for the memory device. Referring to FIG. 6L, an oxide layer 606A is formed over the silicon layer 604 and oxide layer 626 and a polysilicon layer 647 is formed over the oxide layer 606A. Both the lateral edges of the oxide layer 606A and polysilicon layer 647 are then etched as shown in FIG. 6M. Next, material such as N+ dopants are diffused into the silicon layer 604 by ion implantation to form the source 603A area and drain 603B area as shown in FIG. 6N. Referring to FIG. 6O, the polysilicon layer 647 and oxide layer 606A are etched to form the memory device. This memory device includes a top and bottom control gate 617 (CG1) and 607 (CG2), respectively, with top first and second floating gates 615A-B (FG1 and FG2) and bottom third and fourth floating gates 605A-B (FG3 and FG4). Separating the top gates is a first oxide layer 606A and separating the bottom gates is a second oxide layer 606B. Between the top and bottom gates is the tunnel channel 604 area having a source 603A and drain 603B areas adjacent to it. This memory device can perform the operations as described in FIGS. 3A-3D, 4A-4D, and 5A-5D.

Thus, a non-volatile memory with a multi-bit memory cell and method for fabricating the same have been described. The above examples disclose a double control gate structure (top and bottom control gates) to control data bits stored in the polysilicon storage layers of the first, second, third, and fourth floating gates. The above examples, however, can be modified such that the polysilicon layer can be subdivided into any number of sections to provide additional data bit storage areas, all of which made from the polysilicon layer. In the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device, comprising:
   a plurality of memory cells, each memory cell configured to store at least four data bits; and wherein each memory cell includes:
   first and second floating gates, the first floating gate having a charge storage layer to store a $1^{st}$ data bit and the second floating gate having a charge storage layer to store a $2^{nd}$ data bit;
   third and fourth floating gates, the third floating gate having a charge storage layer to store a $3^{rd}$ data bit and the fourth floating gate having a charge storage layer to store a $4^{th}$ data bit;
   first control gate to control the $1^{st}$ and $2^{nd}$ data bits stored in the first and second floating gates, respectively; and
   second control gate to control the $3^{rd}$ and $4^{th}$ data bits stored in the third and fourth floating gates, respectively.

2. The memory device of claim 1, further comprising a channel region formed between the first and second control gates.

3. The memory device of claim 2, wherein the first and second floating gates are formed above the channel region and the third and fourth floating gates are formed below the channel region.

4. The memory device of claim 2, further comprising a dielectric layer formed between the channel region and the first and second floating gates and the first control gate.

5. The memory device of claim 2, further comprising a dielectric layer formed between the channel region and the third and fourth floating gates and the second control gate.

6. A memory device comprising:
   a plurality of memory cells, each memory cell having a plurality of floating gates and control gates, wherein each floating gate includes a charge storage layer, and wherein each memory cell includes top and bottom control gates, each control gate controlling at least two respective data bits; and
   a plurality of word lines and bit lines coupled to the floating gates and control gates for the memory cells.

7. The memory device of claim 6, further comprising a channel region in each memory cell formed between the top and bottom control gates.

8. The memory device of claim 7, wherein the top pair of floating gates are formed above the channel region and the bottom pair of floating gates are formed below the channel region.

9. The memory device of claim 7, further comprising a dielectric layer formed between the channel region and the top pair of floating gates.

10. The memory device of claim 7, further comprising a dielectric layer formed between the channel region and bottom pair of floating gates.

* * * * *